United States Patent
Han

(10) Patent No.: US 12,135,591 B2
(45) Date of Patent: Nov. 5, 2024

(54) ENVIRONMENTAL AND ELECTROMAGNETIC SEAL FOR AUTONOMOUS VEHICLE CONTROL SYSTEMS

(71) Applicant: GM Cruise Holdings LLC, San Francisco, CA (US)

(72) Inventor: Yafei Han, Sunnyvale, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 175 days.

(21) Appl. No.: 17/858,715

(22) Filed: Jul. 6, 2022

(65) Prior Publication Data

US 2024/0010209 A1  Jan. 11, 2024

(51) Int. Cl.
| | |
|---|---|
| *G06F 1/18* | (2006.01) |
| *B60W 50/02* | (2012.01) |
| *B60W 50/06* | (2006.01) |
| *B60W 60/00* | (2020.01) |
| *H01R 13/52* | (2006.01) |
| *H05K 7/14* | (2006.01) |

(52) U.S. Cl.
CPC ......... *G06F 1/183* (2013.01); *B60W 50/0205* (2013.01); *B60W 50/06* (2013.01); *B60W 60/00* (2020.02); *G06F 1/182* (2013.01); *H05K 7/1427* (2013.01); *H01R 13/5202* (2013.01)

(58) Field of Classification Search
CPC .... G06F 1/183; G06F 1/182; B60W 50/0205; B60W 50/06; B60W 60/00; H05K 7/1427; H01R 13/00
See application file for complete search history.

(56) References Cited

U.S. PATENT DOCUMENTS

| 3,127,048 A * | 3/1964 | Winter | H01R 13/447 |
| | | | 174/67 |
| 4,250,349 A * | 2/1981 | Bennett | H01R 13/447 |
| | | | 174/67 |
| 4,649,453 A * | 3/1987 | Iwasawa | G11B 25/063 |
| | | | 206/811 |
| 4,660,912 A * | 4/1987 | Tomek | H01R 13/447 |
| | | | 174/67 |
| 4,671,587 A * | 6/1987 | Lerner | H01R 13/447 |
| | | | 439/142 |
| 4,734,861 A * | 3/1988 | Bertolasi | F16H 59/00 |
| | | | 701/67 |
| 5,573,412 A * | 11/1996 | Anthony | H01R 13/6397 |
| | | | 220/242 |

(Continued)

*Primary Examiner* — Timothy Wilhelm
(74) *Attorney, Agent, or Firm* — Michael DiCato

(57) ABSTRACT

The subject technology is related to autonomous vehicles (AV) and, in particular, to an environmental and electromagnetic seal for autonomous vehicle control systems. The AV includes an autonomous driver system computer (ADSC) fixed to an interior surface of the AV and configured to control the electronic drivetrain, the ADSC including at least one port for connecting with an AV and an elastic conductive cover for selectively sealing the at least port one. The elastic conductive cover comprises a hooking member with an opening that is rotatably connected to the ADSC, cannot be independently removed from the ADSC, and includes an inner surface having at least one extended member with a sealing member that is configured to seal a port of the at least one port.

18 Claims, 10 Drawing Sheets

(56) References Cited

U.S. PATENT DOCUMENTS

| | | | | |
|---|---|---|---|---|
| 5,615,080 A * | 3/1997 | Nishitani | B60R 16/0239 361/647 |
| 5,950,973 A * | 9/1999 | Verma | B60R 16/0239 248/222.51 |
| 6,007,375 A * | 12/1999 | Mackowiak | H01R 13/743 439/571 |
| 6,791,207 B2 * | 9/2004 | Yoshida | B60R 16/0315 307/10.6 |
| 6,832,921 B1 * | 12/2004 | Stewart | H01R 13/447 439/148 |
| 6,872,087 B2 * | 3/2005 | Sandoval | H05K 7/1429 361/752 |
| 6,982,873 B2 * | 1/2006 | Meyer | H02M 7/003 174/15.1 |
| 7,095,626 B2 * | 8/2006 | Seidler | H05K 9/0026 361/818 |
| 7,291,023 B1 * | 11/2007 | Still | G01D 11/245 439/67 |
| 7,530,834 B2 * | 5/2009 | Kuo | H01R 13/506 439/367 |
| 7,674,977 B1 * | 3/2010 | Constantino | H02G 3/14 174/67 |
| 7,764,462 B1 * | 7/2010 | Liu | G06F 1/20 360/99.23 |
| 7,818,098 B2 * | 10/2010 | Koepf | G06F 11/25 701/1 |
| 7,863,781 B2 * | 1/2011 | Marukawa | H01R 13/701 307/326 |
| 7,913,242 B2 * | 3/2011 | Holland | G06F 8/65 701/1 |
| 8,115,100 B2 * | 2/2012 | Peckham | H01R 24/76 174/67 |
| 8,279,625 B2 * | 10/2012 | Just | H05K 1/0218 361/752 |
| 8,454,375 B2 * | 6/2013 | Bauer | B60L 53/16 439/135 |
| 8,473,140 B2 * | 6/2013 | Norris | B62D 1/286 701/23 |
| 8,848,395 B2 * | 9/2014 | Qin | H05K 7/12 361/764 |
| 8,864,515 B2 * | 10/2014 | Oh | H01R 13/465 439/910 |
| 9,083,109 B2 * | 7/2015 | Tetsuya | H01R 13/447 |
| 9,120,484 B1 * | 9/2015 | Ferguson | B60W 50/14 |
| 9,139,097 B2 * | 9/2015 | Chamberlin | B60L 3/0069 |
| 9,456,510 B2 * | 9/2016 | Hattori | H05K 5/0065 |
| 9,531,100 B2 * | 12/2016 | Fukushima | H01R 13/08 |
| 9,552,847 B2 * | 1/2017 | Lin | G11B 33/1493 |
| 9,660,395 B2 * | 5/2017 | Yeom | H01R 13/74 |
| 9,752,715 B2 * | 9/2017 | Heaton | F16L 45/00 |
| 9,756,753 B2 * | 9/2017 | Arita | H05K 7/1427 |
| 9,781,849 B2 * | 10/2017 | Negishi | H05K 5/0056 |
| 9,781,856 B2 * | 10/2017 | Teusch | H05K 5/03 |
| 9,819,114 B2 * | 11/2017 | McCorkle | H01R 13/5213 |
| 9,854,678 B2 * | 12/2017 | Song | H01R 13/6594 |
| 9,888,596 B2 * | 2/2018 | Momose | H05K 3/368 |
| 9,946,890 B2 * | 4/2018 | Valasek | G06F 21/44 |
| 9,948,020 B1 * | 4/2018 | Lin | H01R 13/5213 |
| 9,967,993 B1 * | 5/2018 | Walker | H05K 7/1418 |
| 9,975,510 B2 * | 5/2018 | Foo | B60R 21/34 |
| 9,986,631 B2 * | 5/2018 | Rizza | H01L 24/33 |
| 10,251,285 B2 * | 4/2019 | Nuriya | H01R 13/516 |
| 10,268,108 B2 * | 4/2019 | Muraki | H05K 5/0069 |
| 10,418,746 B2 * | 9/2019 | Sanchez Patino | B60K 1/00 |
| 10,483,700 B2 * | 11/2019 | Chen | H01R 27/00 |
| 10,716,230 B2 * | 7/2020 | Matsuda | H05K 5/0069 |
| 10,729,021 B1 * | 7/2020 | Sanchez | H01R 12/721 |
| 10,811,805 B2 * | 10/2020 | Yamanaka | H05K 5/0069 |
| 10,821,829 B2 * | 11/2020 | Foster | G05D 1/027 |
| 10,944,245 B2 * | 3/2021 | Joyce | H05K 5/03 |
| 10,986,741 B2 * | 4/2021 | Kaneko | B29C 45/14 |
| 11,073,877 B2 * | 7/2021 | Yin | H05K 7/20163 |
| 11,350,538 B2 * | 5/2022 | Kim | G06F 1/1656 |
| 11,363,745 B1 * | 6/2022 | Duncan | H05K 5/0247 |
| 11,374,352 B2 * | 6/2022 | Constantine | H01R 43/005 |
| 11,456,554 B2 * | 9/2022 | Springer | H02J 7/0042 |
| 11,460,626 B2 * | 10/2022 | Morabito | G02B 6/0083 |
| 11,495,908 B2 * | 11/2022 | Mathews | B60L 53/302 |
| 11,511,636 B2 * | 11/2022 | Mathews | B60L 53/302 |
| 11,523,530 B2 * | 12/2022 | Peterson | H02G 1/06 |
| 11,707,955 B2 * | 7/2023 | Smith | B60D 1/36 701/28 |
| 11,710,894 B1 * | 7/2023 | Espinal | H01Q 1/3275 348/148 |
| 11,807,259 B2 * | 11/2023 | Wei | G05D 1/0077 |
| 11,858,314 B2 * | 1/2024 | Iwamoto | B60R 11/04 |
| 11,882,667 B1 * | 1/2024 | Mahoney | H05K 5/0052 |
| 2005/0221641 A1 * | 10/2005 | Saka | H05K 7/026 439/76.2 |
| 2008/0196918 A1 * | 8/2008 | Zadach | H05K 5/068 174/50.5 |
| 2008/0310131 A1 * | 12/2008 | Fino | H05K 7/20454 361/758 |
| 2011/0211311 A1 * | 9/2011 | Shinoda | H05K 5/0213 361/694 |
| 2011/0306223 A1 * | 12/2011 | Bauer | H01R 13/6397 439/136 |
| 2013/0076059 A1 * | 3/2013 | Zalan | B60L 53/16 49/386 |
| 2013/0158838 A1 * | 6/2013 | Yorke | B60W 10/115 701/123 |
| 2013/0250521 A1 * | 9/2013 | Kawai | H05K 7/20854 361/714 |
| 2014/0116771 A1 * | 5/2014 | Masuda | H05K 5/0078 174/520 |
| 2015/0001870 A1 * | 1/2015 | Parcher | B60R 11/0258 296/1.07 |
| 2018/0354462 A1 * | 12/2018 | Pasumarthi | G06F 1/266 |
| 2019/0387185 A1 * | 12/2019 | Hicks | G05D 1/0274 |
| 2020/0257517 A1 * | 8/2020 | Seater | G06F 1/3206 |
| 2021/0176883 A1 * | 6/2021 | Uchida | H05K 5/0039 |
| 2022/0033646 A1 * | 2/2022 | Zia | C08K 9/06 |
| 2022/0055432 A1 * | 2/2022 | Glavinic | H01R 13/665 |
| 2022/0059964 A1 * | 2/2022 | Ando | H01R 4/70 |
| 2022/0108569 A1 * | 4/2022 | Kim | B60R 16/0231 |
| 2022/0167499 A1 * | 5/2022 | Johnston | H05K 1/0296 |
| 2022/0248525 A1 * | 8/2022 | Brandenburg | H05K 1/0204 |
| 2022/0261371 A1 * | 8/2022 | Zhang | G06F 13/4068 |
| 2022/0281042 A1 * | 9/2022 | Pearman | H01R 13/447 |
| 2022/0314827 A1 * | 10/2022 | Podolski | B60L 53/16 |
| 2022/0348157 A1 * | 11/2022 | Sakai | H05K 5/0073 |
| 2022/0376436 A1 * | 11/2022 | Campbell | H01R 13/506 |
| 2022/0390939 A1 * | 12/2022 | Kim | G05D 1/0061 |
| 2023/0116404 A1 * | 4/2023 | Miller | F04D 27/008 417/12 |
| 2023/0156901 A1 * | 5/2023 | Aal | H05K 7/20854 361/715 |
| 2023/0166593 A1 * | 6/2023 | Stadler | B60R 16/0207 726/4 |
| 2023/0200028 A1 * | 6/2023 | Xiang | H05K 7/20254 361/702 |
| 2023/0291141 A1 * | 9/2023 | Shih | H01R 13/5213 |
| 2023/0292459 A1 * | 9/2023 | Rademacher | H05K 7/20872 |
| 2023/0333608 A1 * | 10/2023 | Lee | G06F 1/182 |
| 2024/0030600 A1 * | 1/2024 | Dabrowski | H05K 1/0218 |
| 2024/0040741 A1 * | 2/2024 | Schlotterbeck | H05K 7/20254 |

* cited by examiner

ENVIRONMENTAL AND ELECTROMAGNETIC SEAL FOR AUTONOMOUS VEHICLE CONTROL SYSTEMS

TECHNICAL FIELD

The subject technology is related to vehicles and, in particular, to an environmental and electromagnetic seal for vehicle control systems.

BACKGROUND

Autonomous vehicles are vehicles having computers and control systems that perform driving and navigation tasks that are conventionally performed by a human driver. As autonomous vehicle technologies continue to advance, ride-sharing services will increasingly utilize autonomous vehicles to improve service efficiency and safety. However, autonomous vehicles will be required to perform many of the functions that are conventionally performed by human drivers, such as avoiding dangerous or difficult routes, and performing other navigation and routing tasks necessary to provide safe and efficient transportation. Such tasks may require the collection and processing of large quantities of data disposed on the autonomous vehicle.

BRIEF DESCRIPTION OF THE DRAWINGS

The embodiments herein may be better understood by referring to the following description in conjunction with the accompanying drawings in which like reference numerals indicate identically or functionally similar elements, of which.

DETAILED DESCRIPTION

Figure 1:
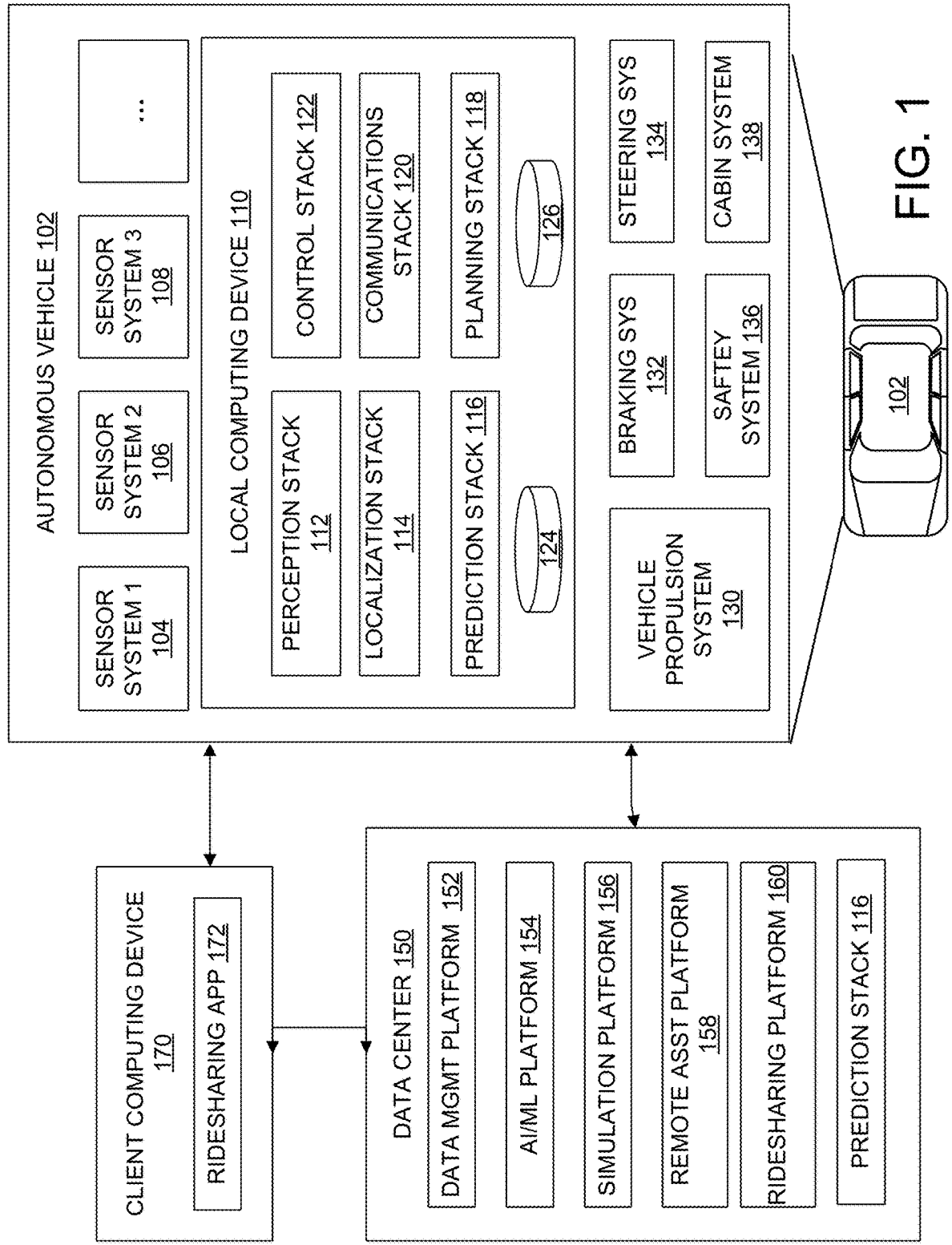
FIG. 1 illustrates an example of an autonomous vehicle (AV) management system according to an example of the instant disclosure.

The detailed description set forth below is intended as a description of various configurations of embodiments and is not intended to represent the only configurations in which the subject matter of this disclosure can be practiced. The appended drawings are incorporated herein and constitute a part of the detailed description. The detailed description includes specific details for the purpose of providing a more thorough understanding of the subject matter of this disclosure. However, it will be clear and apparent that the subject matter of this disclosure is not limited to the specific details set forth herein and may be practiced without these details. In some instances, structures and components are shown in block diagram form in order to avoid obscuring the concepts of the subject matter of this disclosure.

An autonomous vehicle (AV) includes a control system that controls various functions that are conventionally performed by a human driver, such as perception of objects in the environment, tracking of object movement in the environment, planning the movement of the AV based on object movement, and controlling navigation functions of the AV (e.g., acceleration, braking, turning, etc.). The AV may include a centralized controller or a distributed controller, which may be referred to as an autonomous driver system computer (ADSC) to perform various tasks such as acceleration, braking, planning, detection, and so forth. The ADSC may record data such as images, video feeds, audio, and so forth that can be used to improve AV operations. The ADSC can record this information and can later provide this information to a connected system for ingesting the data recorded by the AV. The ADSC may also be configured to perform report diagnostic information, calibrate sensors, and other various functions. In some aspects, the ADSC may include at least one port that connects the AV to the AV command and control system to perform various aspects such as data transfer, calibration, and so forth.

Various aspects of the AV, such as one or more sensors, may use wireless communication to communicate with various components. An illustrative example of a wireless communication sensor includes a tire pressure monitoring system (TPMS) that detects tire pressure and provides information related to tire pressure. A TPMS transmits signals within the ultra-high frequency (UHF) band based on the jurisdiction (e.g., 315 megahertz (MHz) in North America, 433 MHz in Europe) and may transmit information such as a serial number to act as a unique identifier. Various other devices may also transmit in this band and components of the ADSC may include one or more components that can radiate electromagnetic waves, which can interfere with various wireless components of the AV. In particular, when an electrical port is exposed, the ADSC may emit EM waves that can affect the performance of various sensors of the AV and the ADSC may need to be shielded to reduce or remove electromagnetic interference (EMI) effects. The ADSC may also need to be sealed to protect from environmental effects such as dust, liquids, and other objects. An example of a sealing requirement for an electrical port is IP5K2.

Prior versions of an ADSC included a hard plate cover that sealed the ports with mechanical structures, such as a machine screw or a hex nut, that could be easily misplaced during service and/or maintenance based on the small physical size of the component. In addition, the removal of the mechanical structures consumes time and the location of the port must be easily accessible with tooling (such as a screwdriver or a wrench), which limits the location of where the electrical ports are placed on the ADSC when the ports are particularly small.

An ADSC is disclosed that seals at least an electrical port of an AV from environmental and electromagnetic effects. The ADSC includes an elastic conductive cover that is fixed to the ADSC using a closed loop latching feature and a sealing member of an interface plate that exposes at least one electrical port. The elastic conductive cover includes a sealing member that interfaces with the interface plate and seals an electrical port the ADSC. The elastic conductive cover can be selectively removed to expose at least one port associated with the ADSC but cannot be detached from the ADSC without removing the interface plate. The elastic conductive cover may consist of or be coated in an electrically conductive material to block EMI emitted from the ADSC. The elastic conductive cover may also include a hollow extension member that includes a recessed groove configured to seal a recessed region in the interface plate that is associated with an electrical port. The hollow extension member may provide a mechanical seal for the electrical port, and allow the surface of the elastic conductive cover to be compressed inwards during installation or uninstallation.

In some aspects, the elastic conductive cover adds an low impedance path to improve EMI shielding performance and prevent spurious EMI from radiating from the ADSC, removes the need of the hard plate cover. The elastic conductive cover provides sufficient sealing to comport with the IP5K2 requirement while eliminating any tooling needed to expose the electrical ports for various purposes. The elastic conductive cover also increases locations where the electrical ports can be placed.

In some aspects, the elastic conductive cover is described as being attached to an AV. However, the elastic conductive cover may be used in any type of vehicle or other device. For example, the elastic conductive cover may be used in an electric vehicle or a hybrid electric vehicle. In other aspects, the elastic conductive cover may be used in other fixed or mobile electronic devices.

Figure 2:
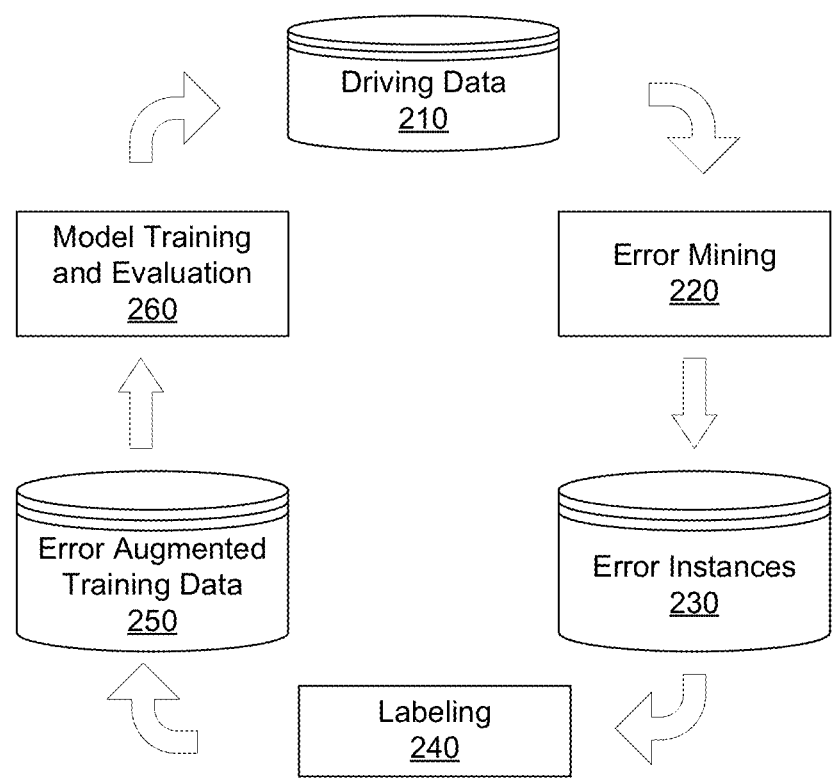
FIG. 2 illustrates an example diagram of a Continuous Learning Machine (CLM) for resolving uncommon scenarios in an AV according to an example of the instant disclosure.
Figure 3:
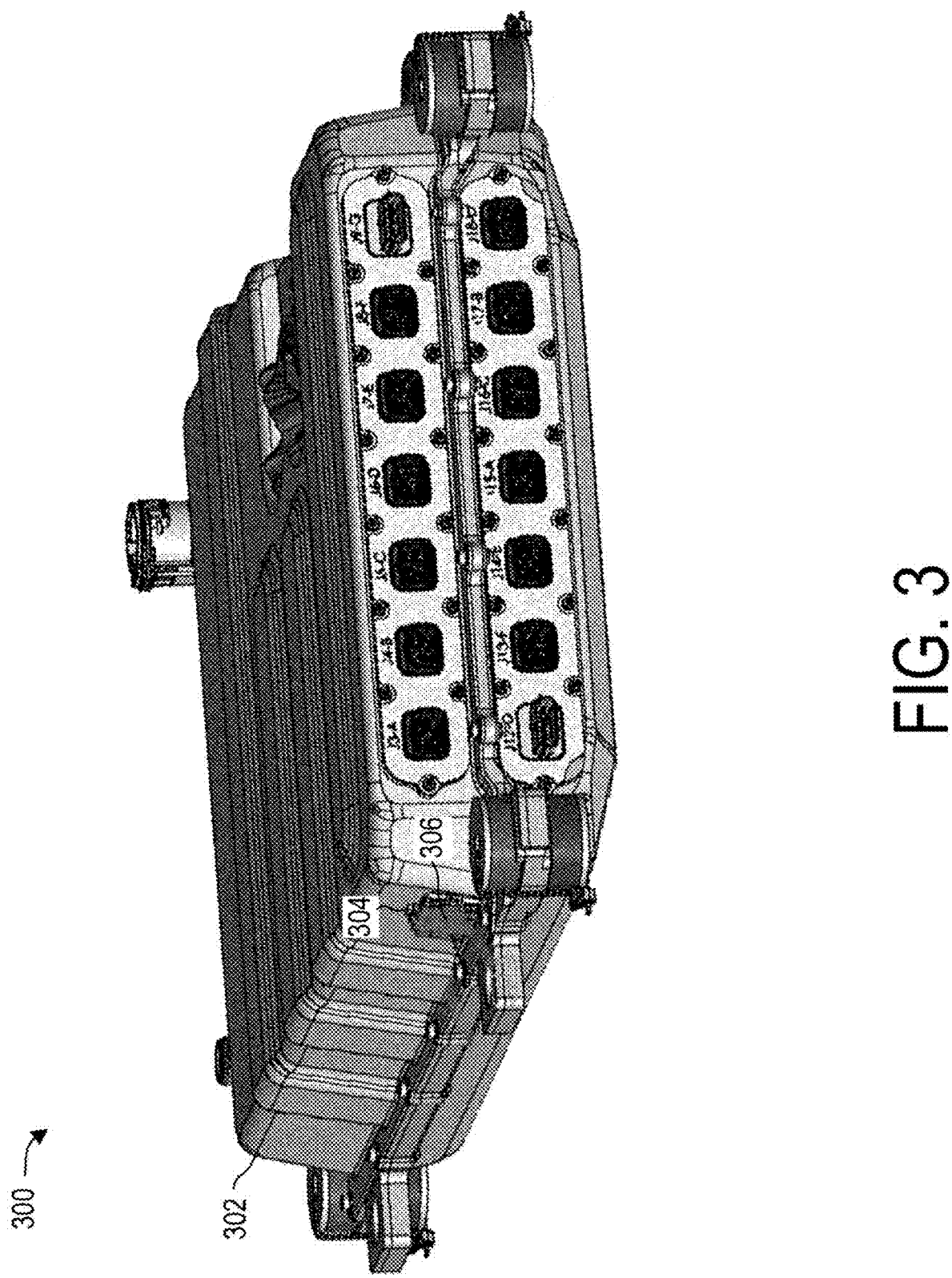
FIG. 3 illustrates an example autonomous driver system computer (ADSC) that is physically attached to an AV to perform functions in accordance with some aspects of the instant disclosure.

A description of an AV management system and a continual learning machine (CLM) for the AV management system, as illustrated in FIGS. 1 and 2, are first disclosed herein. FIG. 3 is a perspective view of an example AV controller that is fixed to the vehicle and provides input/output capabilities. FIGS. 4, 5, 6, 7A, 7B, 8, 9, and 10 provide various illustrations of an environmental and electromagnetic shield for an electrical port that can be used for the input/output capabilities of the AV. The discussion then concludes with a brief description of example devices, as illustrated in FIG. 11. These variations shall be described herein as the various embodiments are set forth. The disclosure now turns to FIG. 1.

FIG. 1 illustrates an example of an AV management system 100. One of ordinary skill in the art will understand that, for the AV management system 100 and any system discussed in the present disclosure, there can be additional or fewer components in similar or alternative configurations. The illustrations and examples provided in the present disclosure are for conciseness and clarity. Other embodiments may include different numbers and/or types of elements, but one of ordinary skill the art will appreciate that such variations do not depart from the scope of the present disclosure.

In this example, the AV management system 100 includes an AV 102, a data center 150, and a client computing device 170. The AV 102, the data center 150, and the client computing device 170 can communicate with one another over one or more networks (not shown), such as a public network (e.g., the Internet, an Infrastructure as a Service (IaaS) network, a Platform as a Service (PaaS) network, a Software as a Service (SaaS) network, other Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

The AV 102 can navigate roadways without a human driver based on sensor signals generated by multiple sensor systems 104, 106, and 108. The sensor systems 104-108 can include different types of sensors and can be arranged about the AV 102. For instance, the sensor systems 104-108 can comprise Inertial Measurement Units (IMUs), cameras (e.g., still image cameras, video cameras, etc.), light sensors (e.g., light detection and ranging (LIDAR) systems, ambient light sensors, infrared sensors, etc.), RADAR systems, global positioning system (GPS) receivers, audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 104 can be a camera system, the sensor system 106 can be a LIDAR system, and the sensor system 108 can be a RADAR system. Other embodiments may include any other number and type of sensors.

The AV 102 can also include several mechanical systems that can be used to maneuver or operate the AV 102. For instance, the mechanical systems can include a vehicle propulsion system 130, a braking system 132, a steering system 134, a safety system 136, and a cabin system 138, among other systems. The vehicle propulsion system 130 can include an electric motor, an internal combustion engine, or both. The braking system 132 can include an engine brake, brake pads, actuators, and/or any other suitable componentry configured to assist in decelerating the AV 102. The steering system 134 can include suitable componentry configured to control the direction of movement of the AV 102 during navigation. The safety system 136 can include lights and signal indicators, a parking brake, airbags, and so forth. The cabin system 138 can include cabin temperature control systems, in-cabin entertainment systems, and so forth. In some embodiments, the AV 102 might not include human driver actuators (e.g., steering wheel, handbrake, foot brake pedal, foot accelerator pedal, turn signal lever, window wipers, etc.) for controlling the AV 102. Instead, the cabin system 138 can include one or more client interfaces (e.g., Graphical User Interfaces (GUIs), Voice User Interfaces (VUIs), etc.) for controlling certain aspects of the mechanical systems 130-138.

The AV 102 can additionally include a local computing device 110 that is in communication with the sensor systems 104-108, the mechanical systems 130-138, the data center 150, and the client computing device 170, among other systems. The local computing device 110 can include one or more processors and memory, including instructions that can be executed by the one or more processors. The instructions can make up one or more software stacks or components responsible for controlling the AV 102; communicating with the data center 150, the client computing device 170, and other systems; receiving inputs from riders, passengers, and other entities within the AV's environment; logging metrics collected by the sensor systems 104-108; and so forth. In this example, the local computing device 110 includes a perception stack 112, a mapping and localization stack 114, a prediction stack 116, a planning stack 118, a communications stack 120, a control stack 122, an AV operational database 124, and a high definition (HD) geospatial database 126, among other stacks and systems.

The perception stack 112 can enable the AV 102 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 104-108, the mapping and localization stack 114, the HD geospatial database 126, other components of the AV, and other data sources (e.g., the data center 150, the client computing device 170, third party data sources, etc.). The perception stack 112 can detect and classify objects and determine their current locations, speeds, directions, and the like. In addition, the perception stack 112 can determine the free space around the AV 102 (e.g., to maintain a safe distance from other objects, change lanes, park the AV, etc.). The perception stack 112 can also identify environmental uncertainties, such as where to look for moving objects, flag areas that may be obscured or blocked from view, and so forth. In some embodiments, an output of the prediction stack can be a bounding area around a perceived object that can be associated with a semantic label that identifies the type of object that is within the bounding area, the kinematic of the object (information about its movement), a tracked path of the object, and a description of the pose of the object (its orientation or heading, etc.). In some examples, the perception stack can also perceive environmental conditions of the AV 102 such as lighting and weather conditions to facilitate perception tasks and other tasks that consider the environmental conditions such as raining, snow, poor visibility in the human visibility spectrum, and the like.

The mapping and localization stack 114 can determine the AV's position and orientation (pose) using different methods from multiple systems (e.g., GPS, IMUs, cameras, LIDAR, RADAR, ultrasonic sensors, the HD geospatial database 126, etc.). For example, in some embodiments, the AV 102 can compare sensor data captured in real-time by the sensor systems 104-108 to data in the HD geospatial database 126 to determine its precise (e.g., accurate to the order of a few centimeters or less) position and orientation. The AV 102 can focus its search based on sensor data from one or more first sensor systems (e.g., GPS) by matching sensor data from one or more second sensor systems (e.g., LIDAR). If the mapping and localization information from one system is unavailable, the AV 102 can use mapping and localization information from a redundant system and/or from remote data sources. In some examples, the mapping and localization stack 114 may also receive the environmental conditions associated with the AV 102 to facilitate the determination of the AV's position and orientation.

The prediction stack 116 can receive information from the localization stack 114 and objects identified by the perception stack 112 and predict a future path for the objects. In some embodiments, the prediction stack 116 can output several likely paths that an object is predicted to take along with a probability associated with each path. For each predicted path, the prediction stack 116 can also output a range of points along the path corresponding to a predicted location of the object along the path at future time intervals along with an expected error value for each of the points that indicates a probabilistic deviation from that point.

The planning stack 118 can determine how to maneuver or operate the AV 102 safely and efficiently in its environment. For example, the planning stack 118 can receive the location, speed, and direction of the AV 102, geospatial data, data regarding objects sharing the road with the AV 102 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 102 from one point to another and outputs from the perception stack 112, localization stack 114, and prediction stack 116. The planning stack 118 can determine multiple sets of one or more mechanical operations that the AV 102 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 118 can select from multiple backup plans to carry out. For example, while preparing to change lanes to turn right at an intersection, another vehicle may aggressively cut into the destination lane, making the lane change unsafe. The planning stack 118 could have already determined an alternative plan for such an event. Upon its occurrence, it could help direct the AV 102 to go around the block instead of blocking a current lane while waiting for an opening to change lanes.

The control stack 122 can manage the operation of the vehicle propulsion system 130, the braking system 132, the steering system 134, the safety system 136, and the cabin system 138. The control stack 122 can receive sensor signals from the sensor systems 104-108 as well as communicate with other stacks or components of the local computing device 110 or a remote system (e.g., the data center 150) to effectuate operation of the AV 102. For example, the control stack 122 can implement the final path or actions from the multiple paths or actions provided by the planning stack 118. This can involve turning the routes and decisions from the planning stack 118 into commands for the actuators that control the AV's steering, throttle, brake, and drive unit.

The communication stack 120 can transmit and receive signals between the various stacks and other components of the AV 102 and between the AV 102, the data center 150, the client computing device 170, and other remote systems. The communication stack 120 can enable the local computing device 110 to exchange information remotely over a network, such as through an antenna array or interface that can provide a metropolitan WIFI network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). The communication stack 120 can also facilitate the local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Bluetooth®, infrared, etc.).

The HD geospatial database 126 can store HD maps and related data of the streets upon which the AV 102 travels. In some embodiments, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane centerline, lane boundaries, type of lane boundaries, etc.) and related attributes (e.g., direction of travel, speed limit, lane type, etc.). The lanes and boundaries layer can also include three-dimensional (3D) attributes related to lanes (e.g., slope, elevation, curvature, etc.). The intersections layer can include geospatial information of intersections (e.g., crosswalks, stop lines, turning lane centerlines and/or boundaries, etc.) and related attributes (e.g., permissive, protected/permissive, or protected only left turn lanes; legal or illegal u-turn lanes; permissive or protected only right turn lanes; etc.). The traffic controls lane can include geospatial information of traffic signal lights, traffic signs, and other road objects and related attributes.

The AV operational database 124 can store raw AV data generated by the sensor systems 104-108, stacks 112-122, and other components of the AV 102 and/or data received by the AV 102 from remote systems (e.g., the data center 150, the client computing device 170, etc.). In some embodiments, the raw AV data can include HD LIDAR point cloud data, image data, RADAR data, GPS data, and other sensor data that the data center 150 can use for creating or updating AV geospatial data or for creating simulations of situations encountered by AV 102 for future testing or training of various machine learning algorithms that are incorporated in the local computing device 110.

The data center 150 can be a private cloud (e.g., an enterprise network, a co-location provider network, etc.), a public cloud (e.g., an IaaS network, a PaaS network, a SaaS network, or other CSP network), a hybrid cloud, a multi-cloud, and so forth. The data center 150 can include one or more computing devices remote to the local computing device 110 for managing a fleet of AVs and AV-related services. For example, in addition to managing the AV 102, the data center 150 may also support a ridesharing service, a delivery service, a remote/roadside assistance service, street services (e.g., street mapping, street patrol, street cleaning, street metering, parking reservation, etc.), and the like.

The data center 150 can send and receive various signals to and from the AV 102 and the client computing device 170. These signals can include sensor data captured by the sensor systems 104-108, roadside assistance requests, software updates, ridesharing pick-up and drop-off instructions, and so forth. In this example, the data center 150 includes a data management platform 152, an Artificial Intelligence/Machine Learning (AI/ML) platform 154, a simulation platform 156, a remote assistance platform 158, and a ridesharing platform 160, among other systems.

The data management platform 152 can be a "big data" system capable of receiving and transmitting data at high velocities (e.g., near real-time or real-time), processing a large variety of data and storing large volumes of data (e.g., terabytes, petabytes, or more of data). The varieties of data can include data having different structured (e.g., structured, semi-structured, unstructured, etc.), data of different types (e.g., sensor data, mechanical system data, ridesharing service, map data, audio, video, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), or data having other heterogeneous characteristics. The various platforms and systems of the data center 150 can access data stored by the data management platform 152 to provide their respective services.

The AI/ML platform 154 can provide the infrastructure for training and evaluating machine learning algorithms for operating the AV 102, the simulation platform 156, the remote assistance platform 158, the ridesharing platform 160, the cartography platform 162, and other platforms and systems. Using the AI/ML platform 154, data scientists can prepare data sets from the data management platform 152; select, design, and train machine learning models; evaluate, refine, and deploy the models; maintain, monitor, and retrain the models; and so on.

The simulation platform 156 can enable testing and validation of the algorithms, machine learning models, neural networks, and other development efforts for the AV 102, the remote assistance platform 158, the ridesharing platform 160, the cartography platform 162, and other platforms and systems. The simulation platform 156 can replicate a variety of driving environments and/or reproduce real-world scenarios from data captured by the AV 102, including rendering geospatial information and road infrastructure (e.g., streets, lanes, crosswalks, traffic lights, stop signs, etc.) obtained from the cartography platform 162; modeling the behavior of other vehicles, bicycles, pedestrians, and other dynamic elements; simulating inclement weather conditions, different traffic scenarios; and so on.

The remote assistance platform 158 can generate and transmit instructions regarding the operation of the AV 102. For example, in response to an output of the AI/ML platform 154 or other system of the data center 150, the remote assistance platform 158 can prepare instructions for one or more stacks or other components of the AV 102.

The ridesharing platform 160 can interact with a customer of a ridesharing service via a ridesharing application 172 executing on the client computing device 170. The client computing device 170 can be any type of computing system, including a server, desktop computer, laptop, tablet, smartphone, smart wearable device (e.g., smartwatch, smart eyeglasses or other Head-Mounted Display (HMD), smart ear pods, or other smart in-ear, on-ear, or over-ear device, etc.), gaming system, or other general purpose computing device for accessing the ridesharing application 172. The client computing device 170 can be a customer's mobile computing device or a computing device integrated with the AV 102 (e.g., the local computing device 110). The ridesharing platform 160 can receive requests to pick up or drop off from the ridesharing application 172 and dispatch the AV 102 for the trip.

FIG. 2 illustrates an example diagram of a CLM 200 that solves uncommon scenarios in a rank-frequency distribution, which may be referred to long-tail prediction problem, in an AV in accordance with some examples. The CLM 200 is a continual loop that iterates and improves based on continual feedback to learn and resolve driving situations experienced by the AV.

The CLM 200 begins with a fleet of AVs that are outfitted with sensors to record a real-world driving scene. In some cases, the fleet of AVs is situated in a suitable environment that represents challenging and diverse situations such as an urban environment to provide more learning opportunities. The AVs record the driving situations into a collection of driving data 210.

The CLM 200 includes an error mining 220 to mine for errors and uses active learning to automatically identify error cases and scenarios having a significant difference between prediction and reality, which are added to a dataset of error instances 230. The error instances are long-tail scenarios that are uncommon and provide rich examples for simulation and training. The error instances 230 store high-value data and prevent storing datasets with situations that are easily resolved.

The CLM 200 also implements a labeling function 240 that includes both automated and manual data annotation of data that is stored in error augmented training data 250 and used for future prediction. The automated data annotation is performed by an ML labeling annotator that uses a neural network trained to identify and label error scenarios in the datasets. Using the ML labeling annotator enables significant scale, cost, and speed improvements that allow the CLM 200 to cover mores scenario of the long tail. The labeling function 240 also includes functionality to allow a human annotator to supplement the ML labeling function. By having both an automated ML labeling function and a manual (human) labeling annotator, the CLM 200 can be populated with dense and accurate datasets for prediction.

The final step of the CLM 200 is model training and evaluation 260. A new model (e.g., a neural network) is trained based on the error augmented training data 250 and the new model is tested extensively using various techniques to ensure that the new model exceeds the performance of the previous model and generalizes well to the nearly infinite variety of scenarios found in the various datasets. The model can also be simulated in a virtual environment and analyzed for performance. Once the new model has been accurately tested, the new model can be deployed in an AV to record driving data 210. The CLM 200 is a continual feedback loop that provides continued growth and learning to provide accurate models for an AV to implement.

In practice, the CLM can handle many uncommon scenarios, but the AV will occasionally need to account for new and infrequency scenarios that would be obvious to a human. For example, an AV may encounter another motorist making an abrupt and sometimes illegal U-turn. The U-turn can be at a busy intersection or could be mid-block, but the U-turn will be a sparse data point as compared to more common behaviors such as moving straight, left turns, right turns, and lane changes. Applying our CLM principles, an initial deployment model may not optimally predict U-turn situations and error situations commonly include U-turns. As the dataset grows and more error scenarios of U-turns are identified, the model can be trained to sufficiently predict a U-turn and allow the AV to accurately navigate this scenario.

The CLM 200 can be applied to any number of scenarios that a human will intuitively recognize including, for example, a K-turn (or a 3-point turn), lane obstructions, construction, pedestrians, animated objects, animals, emergency vehicles, funeral processions, jaywalking, and so forth. The CLM 200 provides a mechanism for continued learning to account for diverse scenarios that are present in the physical world.

FIG. 3 illustrates an example ADSC 300 that is physically attached to an AV to perform various computing functions described above. The ADSC 300 includes a rigid exterior housing 302 that encloses the internal components such as a central controller, storage devices, and other relevant components to perform AV functions. The ADSC 300 should satisfy an IP5K2 sealing requirement, which limits the ingress of dust to prevent interfering with the safe operation of the equipment and prevent vertically dripping water from having a harmful effect when the enclosure is tilted at an angle of 15° from its normal position.

The ADSC 300 may include an electrical port 304 for data transmission/reception with the car. For example, the ADSC 300 may be configured to receive software or firmware to update the internal operations of the AV, and may be configured to transfer drive information that is recorded by the AV. As noted above, the information from the AV can be used to further train further ML models. The ADSC includes an elastic conductive cover 306 that seals the electrical port 304 to satisfy the IP5K2 physical requirements. In some aspects, the elastic conductive cover 306 is configured to be a soft material because module housing and connector ports are made of metal (e.g., a hard material) and two hard surfaces do not form a good environmental seal. In some aspects, the elastic conductive cover 306 can be made of a conductive material that is elastic or can be an elastic material that is coated with a conductive material to form an EMI shield and prevent spurious noise from being emitted through the electrical port. For example, an elastic conductive cover can be made with an elastic material and conductive material or particles can be inserted into the raw material during manufacturing processes (e.g., injection molding).

For example, the electrical port 304 may be a USB Type-C connector that can emit EMI within the UHF band that interferes with a TPMS sensor, or another sensor associated with the AV. In some aspects, the electrical port 304 can be another type of port in another type of vehicle, such as an electric vehicle, a hybrid electric vehicle, or any other type of vehicle that combines many different electrical systems.

In some aspects, the elastic conductive cover 306 is configured to be detachably removed without any tooling to expose the electrical port 304, but remain fixed to the ADSC 300. For example, the elastic conductive cover 306 can include an extension member (e.g., by extruding a hollow region) that is configured to mate with a corresponding recessed region. The extension member can include a recessed groove configured to interface with the interface plate and seal a port (e.g., electrical port 304) to comport with IP5K2 sealing requirements, which prevents entrance of dust and liquids into the electrical port 304.

Figure 4:
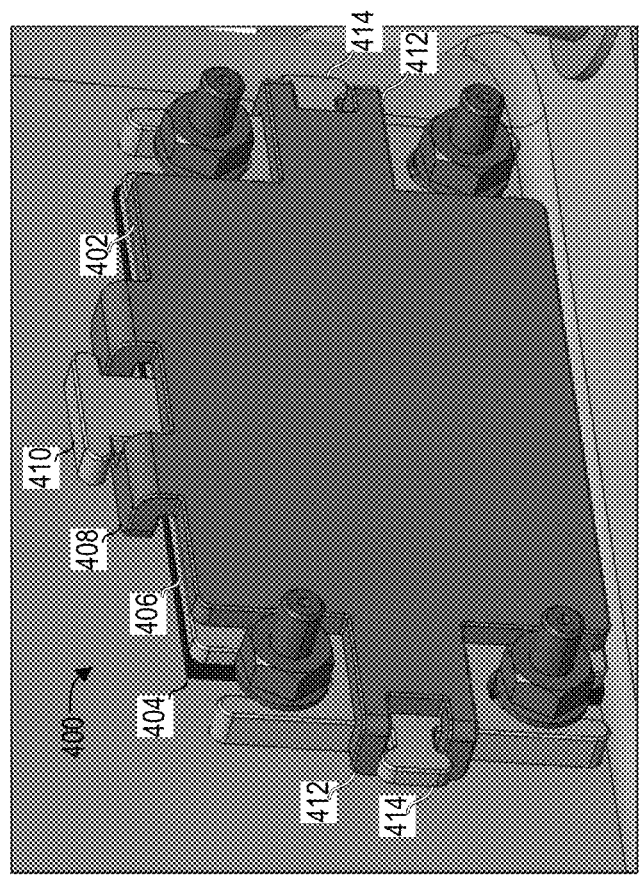
FIG. 4 illustrates a perspective view of an electrical port that includes an elastic conductive cover to seal an ADSC from external environmental objects as well as shielding electromagnetic radiation from within an ADSC in accordance with some aspects of the instant disclosure.

FIG. 4 illustrates a perspective view of an electrical port 400 that includes an elastic conductive cover 402 to seal an ADSC from environmental objects and EMI in accordance with some aspects. In some aspects, a compression layer 404 interposed between an interface plate 406 and a surface of the ADSC. As illustrated in FIG. 4, the interface plate 406 is attached to the surface of the ADSC using mechanical fixtures such as a hex nut or any other suitable mechanical fixture. An example of an interface plate 406 is illustrated herein with reference to FIG. 5.

The elastic conductive cover 402 includes a closed loop member 408 having an opening that a retaining member 410 of the interface plate 406. In some aspects, the retaining member 410 is configured to accommodate at least one surface of the closed loop member 408 while retaining the elastic conductive cover 402. While the interface plate 406 is attached to the ADSC, the retaining member 410 latches the elastic conductive cover 402 to the ADSC, which is further illustrated in FIG. 8.

In some aspects, the elastic conductive cover 402 may include optional external sealing features to improve the quality of the seal. For example, the elastic conductive cover 402 illustrated in FIG. 4 includes an elastic lateral closed loop member 412 that is positioned at each side of the elastic conductive cover 402. Each side of the interface plate 406 includes a planar retaining member 414 that is configured to receive the elastic lateral closed loop member 412 and improve the external attachment of the elastic conductive cover 402 to the interface plate 406. As illustrated in FIG. 4, the elastic lateral closed loop member 412 includes a lateral portion having an extended portion that forms a hooking member, and the hooking member includes a hole for receiving the planar retaining member 414 to provide additional lateral support for the elastic conductive cover 402. In some cases, the elastic lateral closed loop member 412 may be omitted because an interior surface of the elastic conductive cover 402 provides a sufficient seal with at least one port associated.

Figure 5:
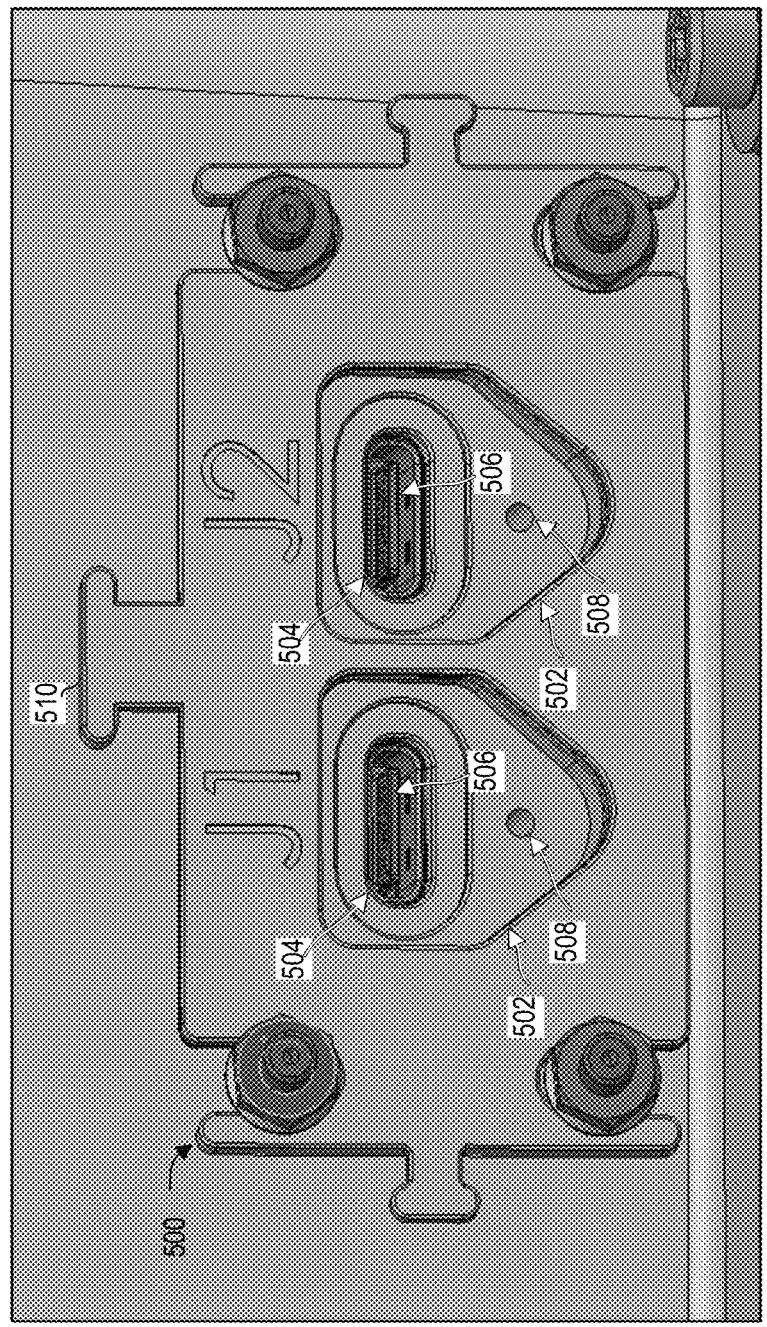
FIG. 5 illustrates a frontal view of an example interface plate that omits an elastic conductive cover in accordance with some aspects of the instant disclosure.

FIG. 5 illustrates a frontal view of an example interface plate 500 that omits an elastic conductive cover in accordance with some aspects. In some aspects, the elastic conductive cover may be attached to a retaining member 510 of the ADSC and is omitted in FIG. 5 to unobtrusively depict the interface plate 500. The interface plate 500 includes at least one recessed portion 502 with a cutout region 504 that is configured to interface with and expose an electrical connector 506. In the illustrative example of FIG. 5, the electrical connector 506 is a USB Type-C connector that interfaces with the interface plate 500 to allow a USB Type-C cable to connect to the electrical components within the ADSC. The recessed portion 502 may also include a lip region configured to interface with a surface of an elastic conductive cover to seal the recessed portion 502 from the environment.

In one illustrative example, the recessed portion 502 may include a connector 508 that for added connection stability for the electrical connector 506. For example, the connector 508 may be an M2 threaded hole that is configured to mate with an M2 screw on the connector of the electrical cable side to ensure that the connection to the electrical connector is tight and stable. For example, added stability to the electrical connector 506 may be necessary to ensure that the electrical cable does not disconnect due to vehicle vibration, cable movement, and so forth.

Figure 6:
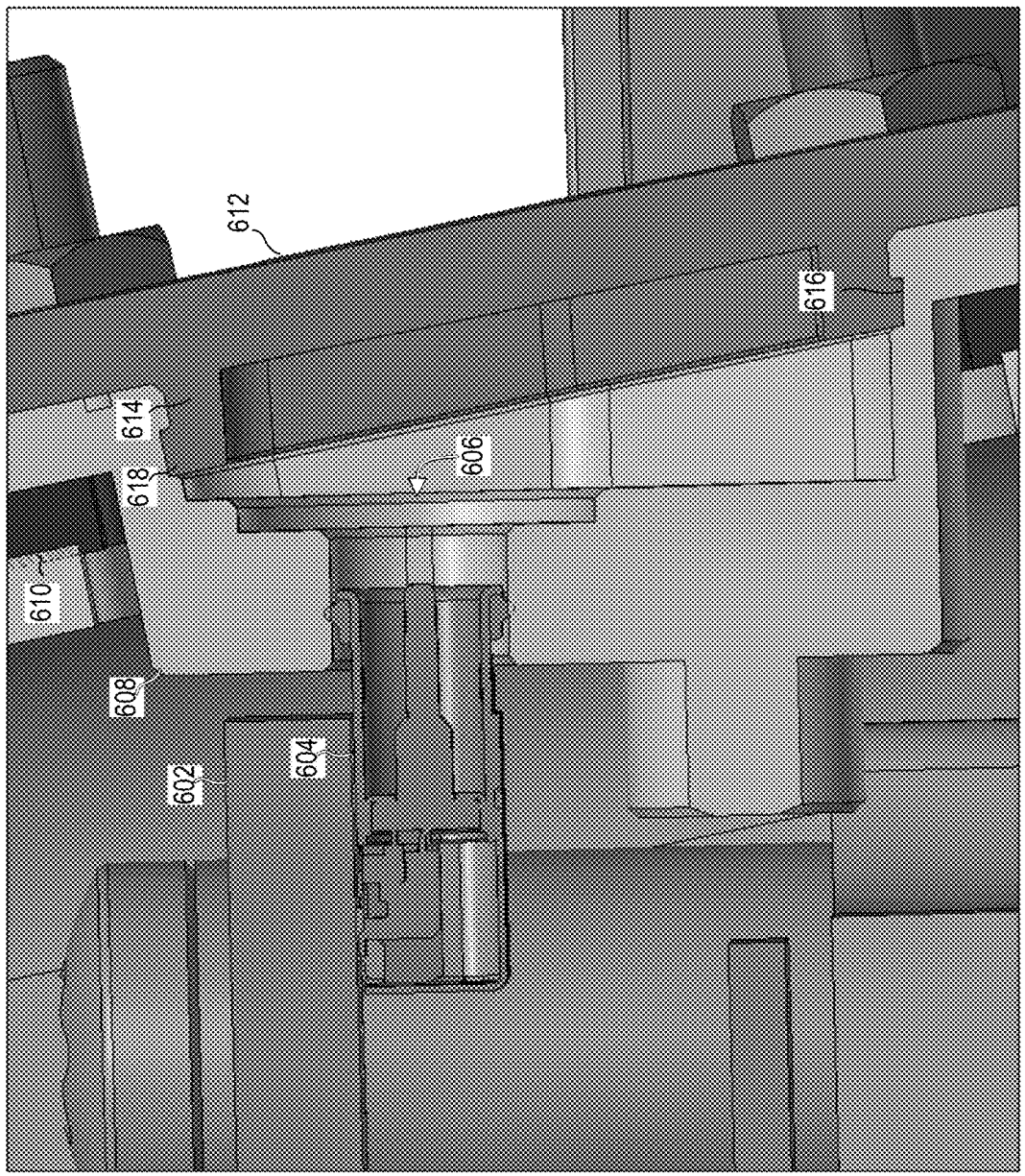
FIG. 6 illustrates a cross-sectional view of an elastic conductive cover attached to an interface plate that is fixed to the ADSC in accordance with some aspects of the instant disclosure.

FIG. 6 illustrates a cross-sectional view of an elastic conductive cover attached to an interface plate that is fixed to the ADSC in accordance with some aspects. The ADSC includes a printed circuit board (PCB) 602 with an electrical connector 604 fixed to the PCB 602. The electrical connector 604 laterally extends from the PCB 602 and interfaces with an opening 606 in the interface plate 608 (e.g., the interface plate 406). The interface plate 406 is mounted to the ADSC via a fixture via a compression layer 610 (e.g., compression layer 404).

In some aspects, an elastic conductive cover 612 (e.g., elastic conductive cover 402) is attached to the interface plate 608 via an extension member 614 that protrudes from a planar surface of the elastic conductive cover 612 and attaches and fixes the elastic conductive cover 612 to the interface plate 608. In some examples, the interface plate 608 includes a circumferential groove 616 along an interior surface of a recessed portion (e.g., recessed portion 502) that is configured to receive a sealing portion 618 that is integral to the extension member 614.

As illustrated in FIG. 6, the sealing member 618 is configured to fit into the circumferential groove 616 and seal the electrical connector 604 from the environment that the ADSC is exposed to. In some aspects, the ADSC is fixed to an interior portion of an AV, but may still require protection from liquids, dust, and other objects. In addition, the elastic conductive cover may also create a low impedance enclosed electrical path to the ADSC metal housing. Thus, in the event EM waves are emitted from the electrical connector 604, the elastic conductive cover 612 blocks the transmission of spurious EMI effects from the ADSC. In some aspects, spurious EM waves may affect performance of other components within the AV, EV, or other system.

Figure 7A:
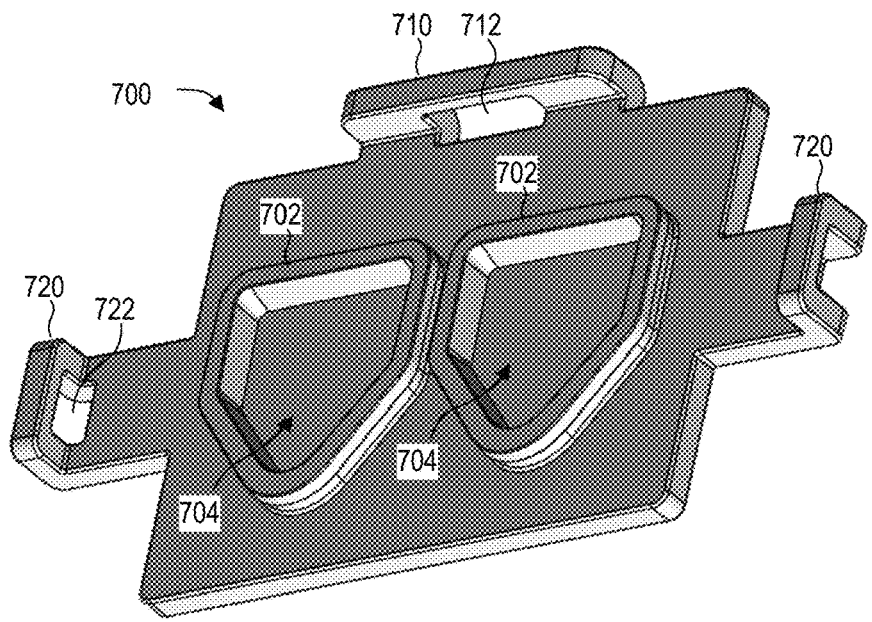
FIG. 7A is a perspective view of an interior surface of an example elastic conductive cover for sealing at least two electrical ports in accordance with some aspects of the instant disclosure.

FIG. 7A is a perspective view of an interior surface of an example elastic conductive cover 700 for sealing at least two electrical ports in accordance with some aspects of the disclosure. The interior surface includes extension members 702 and each extension member 702 includes a hollow portion 704. The extension member includes a sealing portion (e.g., sealing portion 618) that engages a corresponding recessed portion (e.g., circumferential groove 616) to seal an electrical connector (e.g., electrical connector 604) and prevent ingress of materials. In some aspects, the example elastic conductive cover 700 may also prevent the egress of electromagnetic radiation based on creating an enclosed conductive shield. For example, when an EM wave is radiated from within the electrical port and radiates toward the elastic conductive cover 700, the EM wave will strike and be shielded by elastic conductive cover 700 due to a high conductive enclosed path to a module housing from the elastic conductive cover 700. The hollow portion 704 provides an elastic seal that allows a surface area within the hollow portion 704 to be displaced without affecting the seal formed by the sealing portion 618.

The elastic conductive cover 700 also includes an elastic closed loop member 710 (e.g., closed loop member 408) and includes an opening 712 that is configured to receive a retaining member (e.g. retaining member 510) to fix the elastic conductive cover 700 to the ADSC. As illustrated in FIG. 7A, the elastic closed loop member 710 is located in a medial position of the elastic conductive cover and is bent to accept a retaining member that is disposed between the elastic conductive cover 700 and a surface of the ADSC.

The elastic conductive cover 700 illustrated in the example of FIG. 7A also includes elastic lateral closed loop members 720 that includes an opening for receiving a planar retaining member (e.g., planar retaining member 414). Other aspects of the disclosure may omit the elastic lateral closed loop members 720 based on the environmental seal provided by the extension member that includes a sealing portion (e.g., sealing portion 618).

Figure 7B:
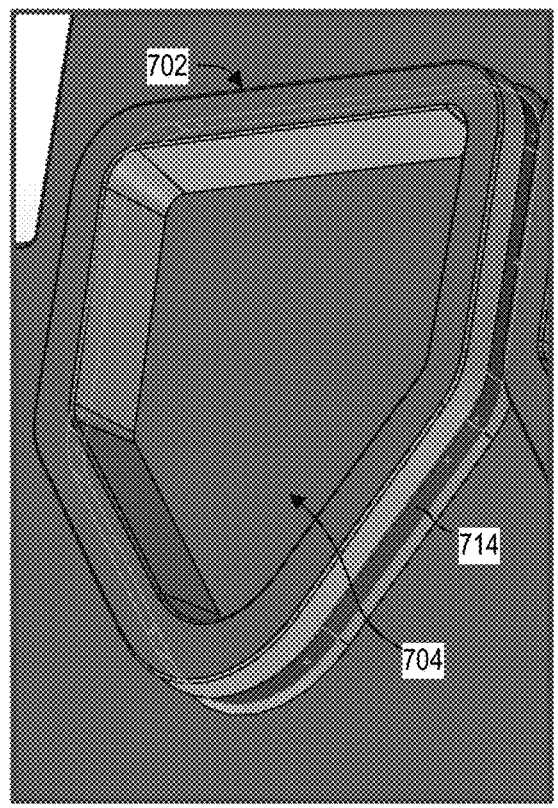
FIG. 7B illustrates a more detailed perspective view of an extension member that extends from a surface of the elastic conductive cover that fits into the cutout of an interface plate to create a better sealing condition and includes the hollow portion to reduce the installation and removal challenges in accordance with some aspects of the instant disclosure.

FIG. 7B illustrates a more detailed perspective view of an extension member 702 that extends from a surface of the elastic conductive cover 700 and includes the hollow portion 704. The hollow portion 704 allows the surface area of the elastic conductive cover 700 to be compressed inwards during install/uninstall of the elastic conductive cover 700, adds an extra reflection path to improve EMI shielding performance, and reduces molding material and volume shrink impact. The extension member 702 also includes a circumferential groove 714 (e.g., a protrusion with an undercut) that allows an elastic seal to clip into a recessed area of an interface plate, which improves ingress protection (IP) sealing and EMI shielding and removes the need for tooling to install/uninstall the elastic conductive cover 700 and expose or shield and electrical port.

Figure 8:
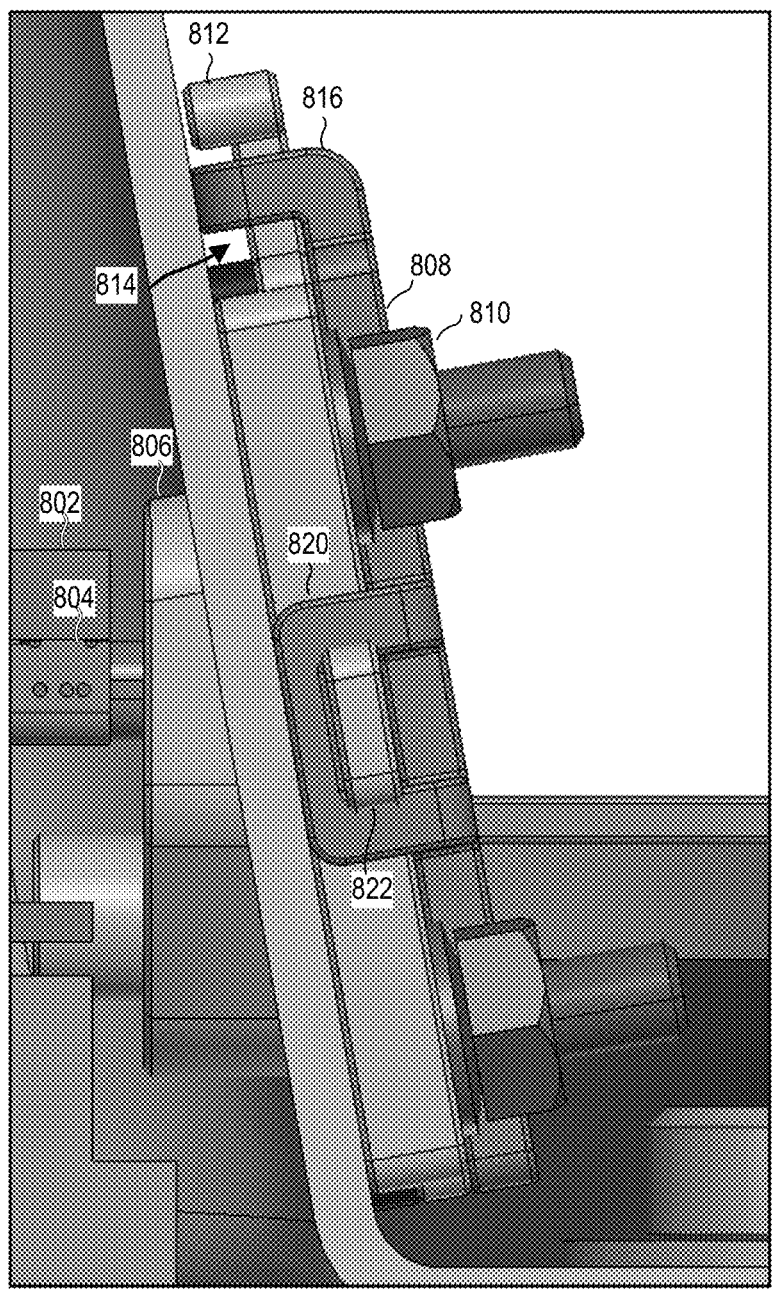
FIG. 8 is a cross-sectional view of the ADSC that illustrates an electrical port connected to a printed circuit board (PCB) that interfaces with an interface plate in accordance with some aspects of the instant disclosure.

FIG. 8 is a cross-sectional view of the ADSC that illustrates an electrical connector 804 connected to a PCB 802 and the electrical port 804 interfaces with an interface plate 806 (e.g., interface plate 500) to expose or seal the electrical port 804 with an elastic conductive cover 808. The interface plate 806 extends through an opening on the ADSC and is fixed to the ADSC using a fastener 810 and includes a retaining member 812 that creates an opening 814 and fixes the elastic conductive cover 808 to the ADSC so that the elastic conductive cover 808 can be configured to expose the electrical port 804. In one illustrative aspect, the elastic conductive cover 808 includes a closed loop member 816 that is bent to engage the retaining member 812 and be fixed to the ADSC in a rotatable manner to allow exposing or sealing of the electrical port 804.

FIG. 8 also illustrates a lateral closed loop member 820 than provides additional sealing capabilities for the elastic conductive cover 808. As illustrated in FIG. 8, an opening in the lateral closed loop member 820 is configured to receive a planar retaining member 822 that is integral to the interface plate 806. In some aspects, the lateral closed loop members serve as an additional securing feature and remove the need for tooling to install/uninstall the elastic conductive cover 808.

Figure 9:
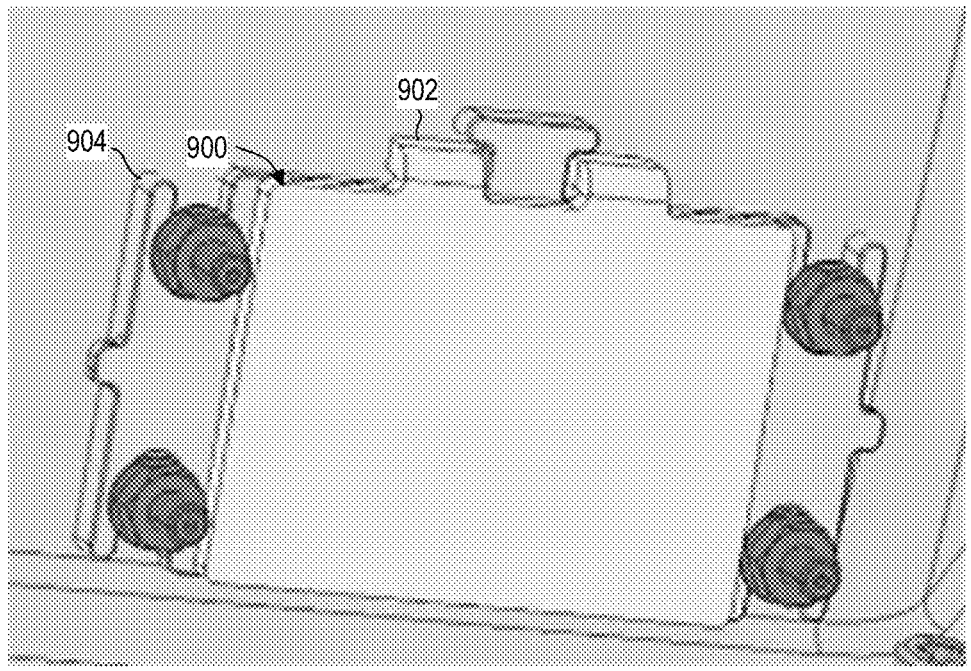
FIG. 9 illustrates another example of an elastic conductive cover in accordance with some aspects of the instant disclosure.

FIG. 9 illustrates another example of an elastic conductive cover 900. In the example of FIG. 9, the elastic conductive cover 900 omits the lateral closed loop member because the sealing provided with the extension member on the interior surface provides sufficient sealing to comport with IP5K2 requirements and provides sufficient EMI shielding. In the example of FIG. 9, a closed loop member 902 of the elastic conductive cover is placed in a medial position and allows rotation of the elastic conductive cover 900 to expose at least one electrical port. In other aspects, additional types of connectors can be sealed. The interface plate 904 illustrated in FIG. 9 includes the planar retaining features in the event a different elastic conductive cover is needed with additional sealing requirements.

Figure 10:
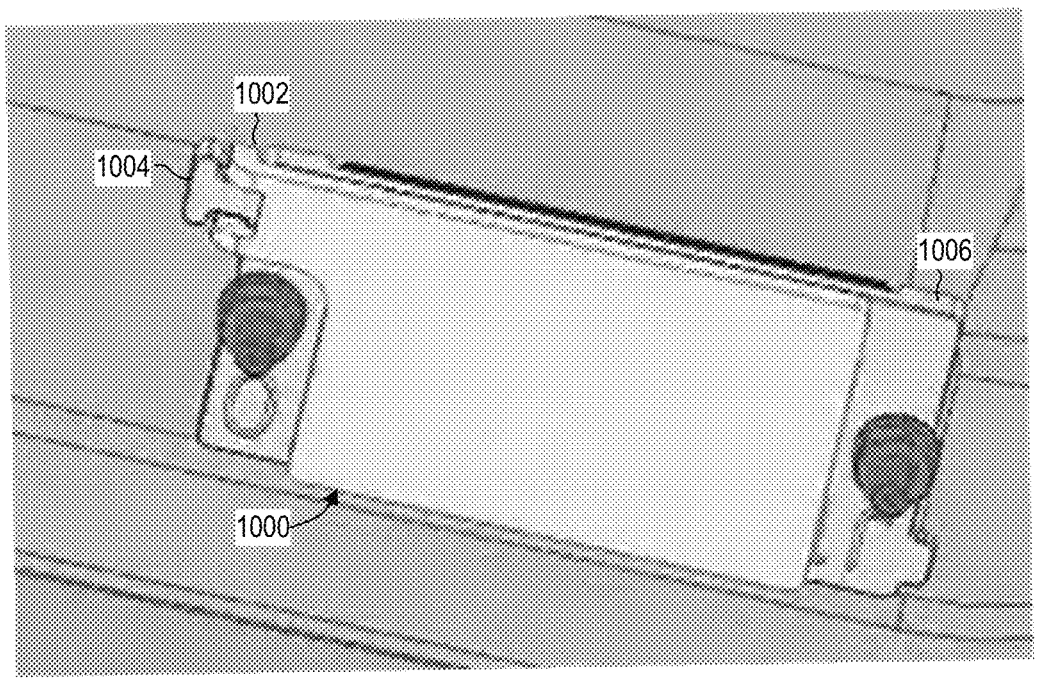
FIG. 10 illustrates another example of an elastic conductive cover that uses a single closed loop member to latch an elastic conductive cover to the ADSC in accordance with some aspects of the instant disclosure.
Figure 11:
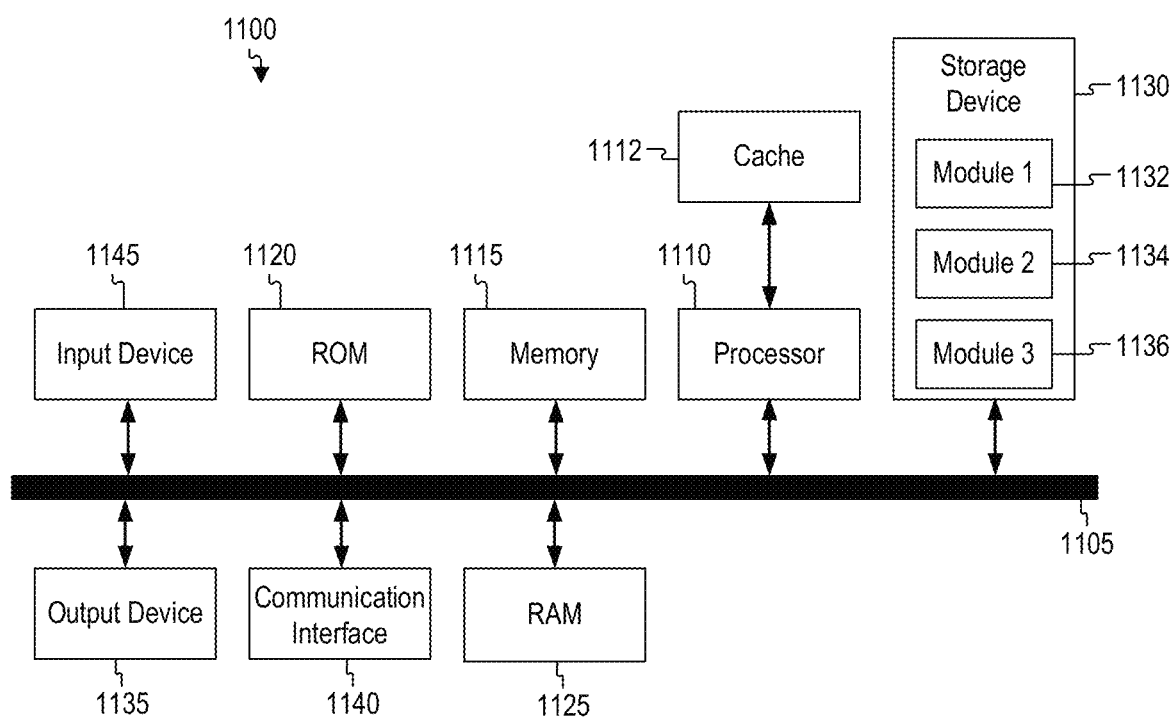
FIG. 11 shows an example of a computing system, which can be for example any computing device that can implement components of the system.

FIG. 10 illustrates another example of an elastic conductive cover 1000 that uses a single closed loop member 1002 to fix the elastic conductive cover 1000 to the ADSC. As illustrated in FIG. a retaining member 1004 of the interface plate 1006 can be position at a corner of a lateral side to allow rotation to expose the electrical ports.

In some aspects, the elastic conductive cover is attached to the ADSC and configures the elastic conductive cover to be rotated to expose the electrical ports of the ADSC without the need for tooling. The closed loop member of the elastic conductive cover latches the elastic conductive cover to the ADSC and prevents misplacement of covers for the electrical ports. In addition, the closed loop member removes the need for tooling to install/uninstall the elastic conductive cover and allows electrical connection to the ports. In addition, the interface plate can provide security features to ensure a tight and stable connection.

FIG. 11 shows an example of computing system 1100, which can be for example any computing device for training or executing a neural network, or any component thereof in which the components of the system are in communication with each other using connection 1105. Connection 1105 can be a physical connection via a bus, or a direct connection into processor 1110, such as in a chipset architecture. Connection 1105 can also be a virtual connection, networked connection, or logical connection.

In some embodiments, computing system 1100 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example computing system 1100 includes at least one processing unit (a central processing unit (CPU) or processor) 1110 and connection 1105 that couples various system components including system memory 1115, such as read-only memory (ROM) 1120 and random-access memory (RAM) 1125 to processor 1110. Computing system 1100 can include a cache of high-speed memory 1112 connected directly with, in close proximity to, or integrated as part of processor 1110.

Processor 1110 can include any general purpose processor and a hardware service or software service, such as services 1132, 1134, and 1136 stored in storage device 1130, configured to control processor 1110 as well as a special-purpose processor where software instructions are incorporated into the actual processor design. Processor 1110 may essentially be a completely self-contained computing system, containing multiple cores or processors, a bus, memory controller, cache, etc. A multi-core processor may be symmetric or asymmetric.

To enable user interaction, computing system 1100 includes an input device 1145, which can represent any number of input mechanisms, such as a microphone for speech, a touch-sensitive screen for gesture or graphical input, keyboard, mouse, motion input, speech, etc. Computing system 1100 can also include output device 1135, which can be one or more of a number of output mechanisms known to those of skill in the art. In some instances, multimodal systems can enable a user to provide multiple types of input/output to communicate with computing system 1100. Computing system 1100 can include communications interface 1140, which can generally govern and manage the user input and system output. There is no restriction on operating on any particular hardware arrangement, and therefore the basic features here may easily be substituted for improved hardware or firmware arrangements as they are developed.

Storage device 1130 can be a non-volatile memory device and can be a hard disk or other types of computer readable media which can store data that are accessible by a computer, such as magnetic cassettes, flash memory cards, solid state memory devices, digital versatile disks, cartridges, RAMs, ROM, and/or some combination of these devices.

The storage device 1130 can include software services, servers, services, etc., that when the code that defines such software is executed by the processor 1110, it causes the system to perform a function. In some embodiments, a hardware service that performs a particular function can include the software component stored in a computer-readable medium in connection with the necessary hardware components, such as processor 1110, connection 1105, output device 1135, etc., to carry out the function.

The computing system 1100 can also include a graphical processing unit (GPU) array 1150 or any similar processor for performing massively complex and parallel mathematical operations such as simulations, games, neural network training, and so forth. The GPU array 1150 includes at least one GPU and is illustrated to have three GPUs comprising GPU 1152, GPU 1154, and GPU 1156. However, the GPU array 1150 can be any number of GPUs. In some examples, the GPU core can be integrated into a die of the processor 1110.

For clarity of explanation, in some instances, the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can comprise, for example, instructions and data which cause or otherwise configure a general purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can comprise hardware, firmware and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Illustrative examples of the disclosure include:

Aspect 1. An autonomous vehicle (AV), comprising: an electronic drivetrain configured to move the AV; and an autonomous driver system computer (ADSC) fixed to an interior surface of the AV and configured to control the electronic drivetrain, the ADSC including at least one port for connecting with the AV and an elastic conductive cover for selectively sealing the at least one port without tooling, wherein the elastic conductive cover comprises a hooking member with an opening that is rotatably connected to the ADSC and latches the elastic conductive cover to ADSC so that the elastic conductive cover cannot be independently removed from the ADSC, and includes an inner surface having at least one extended member with a circumferential groove configured to seal a port of the at least one port.

Aspect 2. The AV of Aspect 1, wherein the at least one port comprises a port for installation of software and firmware of the ADSC and another port for testing functions of the ADSC.

Aspect 3. The AV of any of Aspects 1 to 2, wherein the at least one port comprises a port for data transfer of information recorded by the AV and another port for diagnostics associated with at least one device of the ADSC or another device integral to the AV.

Aspect 4. The AV of any of Aspects 1 to 3, further comprising: an interface plate that is attached to a surface of the ADSC via tooling and includes at least one recessed region that exposes the at least one port, wherein each recessed region includes a recessed portion corresponding to a cable that is inserted into the at least one port.

Aspect 5. The AV of any of Aspects 1 to 4, wherein the interface plate includes a retaining member configured to be placed into the opening of the hooking member of the elastic conductive cover to fix the elastic conductive cover to the ADSC while the interface plate is fixed to the ADSC.

Aspect 6. The AV of any of Aspects 1 to 5, wherein the recessed portion comprises a shape configured to receive a cable having a corresponding shape.

Aspect 7. The AV of any of Aspects 1 to 6, wherein the at least one extended member is configured to interface with the recessed portion to block electromagnetic interference from the ADSC that interferes with at least one sensor associated with the AV.

Aspect 8. The AV of any of Aspects 1 to 7, wherein the at least one sensor comprises a tire pressure monitor sensor.

Aspect 9. The AV of any of Aspects 1 to 8, wherein each side of the interface plate includes a planar side flange.

Aspect 10. The AV of any of Aspects 1 to 9, wherein each side of the elastic conductive cover includes an elastic retaining member configured to interface with the planar side flange to further seal the elastic conductive cover to the interface plate.

Aspect 11. An electronic control system for controlling at least one function of a vehicle, the electronic control system comprising: a printed circuit board including at least one electrical port to interface with electrical components of the electronic control system; an interface plate that is fixed to the electronic control system and exposes an electrical port for electrical connection; and an elastic conductive cover for selectively sealing the at least one electrical port, wherein the elastic conductive cover comprises a hooking member with an opening that is rotatably connected to the electronic control system and latches the elastic conductive cover to electronic control system so that the elastic conductive cover cannot be independently removed from the electronic control system, and includes an inner surface having at least one extended member with a circumferential groove configured to seal a port of the at least one electrical port without tooling.

Aspect 12. The electronic control system of Aspect 11, wherein the at least one electrical port comprises a port for installation of software and firmware of the electronic control system and another port for testing functions of the electronic control system.

Aspect 13. The electronic control system of any of Aspects 11 to 12, wherein the at least one electrical port comprises a port for data transfer of information recorded by the electronic control system and another port for diagnostics associated with at least one device of the electronic control system or another device integral to the electronic control system.

Aspect 14. The electronic control system of any of Aspects 11 to 13, wherein the interface plate that is attached to a surface of the electronic control system via tooling and includes at least one recessed region that exposes the at least one electrical port, wherein each recessed region includes a recessed portion corresponding to a cable that is inserted into the at least one electrical port.

Aspect 15. The electronic control system of any of Aspects 11 to 14, wherein the interface plate includes a retaining member configured to be placed into the opening of the hooking member of the elastic conductive cover to fix the elastic conductive cover to the electronic control system while the interface plate is fixed to the electronic control system.

Aspect 16. The electronic control system of any of Aspects 11 to 15, wherein the recessed portion comprises a shape configured to receive a cable having a corresponding shape.

Aspect 17. The electronic control system of any of Aspects 11 to 16, wherein the at least one extended member is configured to interface with the recessed portion to block electromagnetic interference from the electronic control system that interferes with at least one sensor associated with the electronic control system.

Aspect 18. The electronic control system of any of Aspects 11 to 17, wherein the at least one sensor comprises a tire pressure monitor sensor.

Aspect 19. The electronic control system of any of Aspects 11 to 18, wherein each side of the interface plate includes a planar side flange.

Aspect 20. The electronic control system of any of Aspects 11 to 19, wherein each side of the elastic conductive cover includes an elastic retaining member configured to interface with the planar side flange to further seal the elastic conductive cover to the interface plate.

What is claimed is:

1. An autonomous vehicle (AV), comprising:
an electronic drivetrain configured to move the AV; and
an autonomous driver system computer (ADSC) fixed to an interior surface of the AV and configured to control the electronic drivetrain, the ADSC including at least one port for connecting with the AV and an elastic conductive cover for selectively sealing the at least one port without tooling, wherein the at least one port comprises a port for data transfer of information recorded by the AV and another port for diagnostics associated with at least one device of the ADSC or another device integral to the AV, and
wherein the elastic conductive cover comprises a hooking member with an opening that is rotatably connected to the ADSC and latches the elastic conductive cover to the ADSC so that the elastic conductive cover cannot be independently removed from the ADSC, and includes an inner surface having at least one extended member with a recessed groove configured to seal a port of the at least one port.

2. The AV of claim 1, wherein the at least one port further comprises a port for installation of software and firmware of the ADSC and another port for testing functions of the ADSC.

3. The AV of claim 1, further comprising:
an interface plate that is attached to a surface of the ADSC via tooling and includes at least one recessed region that exposes the at least one port, wherein each recessed region includes a recessed portion corresponding to a cable that is inserted into the at least one port.

4. The AV of claim 3, wherein the interface plate includes a retaining member configured to be placed into the opening of the hooking member of the elastic conductive cover to fix the elastic conductive cover to the ADSC while the interface plate is fixed to the ADSC.

5. The AV of claim 4, wherein the recessed portion comprises a shape configured to receive a cable having a corresponding shape.

6. The AV of claim 5, wherein the at least one extended member is configured to interface with the recessed portion to block electromagnetic interference from the ADSC that interferes with at least one sensor associated with the AV.

7. The AV of claim 6, wherein the at least one sensor comprises a tire pressure monitor sensor.

8. The AV of claim 7, wherein each side of the interface plate includes a planar side flange.

9. The AV of claim 8, wherein each side of the elastic conductive cover includes an elastic retaining member configured to interface with the planar side flange to further seal the elastic conductive cover to the interface plate.

10. An electronic control system for controlling at least one function of a vehicle, the electronic control system comprising:
a printed circuit board including at least one electrical port to interface with electrical components of the electronic control system, wherein the at least one electrical port comprises a port for installation of software and firmware of the electronic control system and another port for testing functions of the electronic control system;
an interface plate that is fixed to the electronic control system and exposes an electrical port for electrical connection; and
an elastic conductive cover for selectively sealing the at least one electrical port, wherein the elastic conductive cover comprises a hooking member with an opening that is rotatably connected to the electronic control system and latches the elastic conductive cover to the electronic control system so that the elastic conductive cover cannot be independently removed from the electronic control system, and includes an inner surface having at least one extended member with a recessed groove configured to seal a port of the at least one electrical port without tooling.

11. The electronic control system of claim 10, wherein the at least one electrical port further comprises a port for data transfer of information recorded by the electronic control system and another port for diagnostics associated with at least one device of the electronic control system or another device integral to the electronic control system.

12. The electronic control system of claim 10, wherein the interface plate that is attached to a surface of the electronic control system via tooling and includes at least one recessed region that exposes the at least one electrical port, wherein each recessed region includes a recessed portion corresponding to a cable that is inserted into the at least one electrical port.

13. The electronic control system of claim 12, wherein the interface plate includes a retaining member configured to be placed into the opening of the hooking member of the elastic conductive cover to fix the elastic conductive cover to the electronic control system while the interface plate is fixed to the electronic control system.

14. The electronic control system of claim 13, wherein the recessed portion comprises a shape configured to receive a cable having a corresponding shape.

15. The electronic control system of claim 14, wherein the at least one extended member is configured to interface with the recessed portion to block electromagnetic interference from the electronic control system that interferes with at least one sensor associated with the electronic control system.

16. The electronic control system of claim 15, wherein the at least one sensor comprises a tire pressure monitor sensor.

17. The electronic control system of claim 16, wherein each side of the interface plate includes a planar side flange.

18. The electronic control system of claim 17, wherein each side of the elastic conductive cover includes an elastic retaining member configured to interface with the planar side flange to further seal the elastic conductive cover to the interface plate.

* * * * *